(12) United States Patent
Li et al.

(10) Patent No.: US 11,735,945 B2
(45) Date of Patent: Aug. 22, 2023

(54) BATTERY CHARGING CONTROL METHOD AND DEVICE

(71) Applicant: JIANGSU CONTEMPORARY AMPEREX TECHNOLOGY LIMITED, Liyang (CN)

(72) Inventors: Linfu Li, Liyang (CN); Shichao Li, Liyang (CN)

(73) Assignee: JIANGSU CONTEMPORARY AMPEREX TECHNOLOGY LIMITED, Changzhou (CN)

(*) Notice: Subject to any disclaimer, the term of this patent is extended or adjusted under 35 U.S.C. 154(b) by 0 days.

(21) Appl. No.: 17/953,228

(22) Filed: Sep. 26, 2022

(65) Prior Publication Data
US 2023/0018810 A1 Jan. 19, 2023

Related U.S. Application Data

(63) Continuation of application No. PCT/CN2021/114612, filed on Aug. 25, 2021.

(51) Int. Cl.
*H02J 7/00* (2006.01)
*G01R 31/3835* (2019.01)
*G01R 31/36* (2020.01)

(52) U.S. Cl.
CPC .... *H02J 7/007184* (2020.01); *G01R 31/3648* (2013.01); *G01R 31/3835* (2019.01)

(58) Field of Classification Search
CPC .......... H02J 7/007184; G01R 31/3648; G01R 31/3835
(Continued)

(56) References Cited

U.S. PATENT DOCUMENTS 5,196,779 A * 3/1993 Alexandres ........... H01M 10/44
320/DIG. 12
5,656,915 A * 8/1997 Eaves ................... H02J 7/0014
320/120
(Continued)

FOREIGN PATENT DOCUMENTS

CN 201846097 U 5/2011
CN 104300595 A 1/2015
(Continued)

OTHER PUBLICATIONS

International Search Report received in the corresponding International Application PCT/CN2021/114612, dated Oct. 15, 2021.
(Continued)

*Primary Examiner* — M Baye Diao
(74) *Attorney, Agent, or Firm* — Kilpatrick Townsend & Stockton LLP

(57) ABSTRACT

This application provides a battery charging control method and device. Voltages of N cell units in an $M^{th}$ sampling period are obtained, and a voltage of the battery at each sampling moment among K sampling moments in said sampling period is calculated. Charging of the battery is stopped when the voltage of the battery increases monotonically in the $M^{th}$ sampling period and a trend of a fitting curve of the voltage of at least one cell unit among the N cell units in said sampling period is not rising.

18 Claims, 3 Drawing Sheets

(58) Field of Classification Search
USPC .......................................................... 320/107
See application file for complete search history.

(56) References Cited

U.S. PATENT DOCUMENTS

| | | | | |
|---|---|---|---|---|
| 5,686,815 | A | * | 11/1997 | Reipur .................. H01M 10/48 320/116 |
| 6,891,354 | B2 | * | 5/2005 | Fazakas ........... G01R 19/16542 320/137 |
| 2006/0152224 | A1 | * | 7/2006 | Kim .................... G01R 31/389 324/430 |
| 2010/0007310 | A1 | * | 1/2010 | Kawamoto ......... H01M 10/486 320/134 |
| 2022/0018907 | A1 | * | 1/2022 | Ekler .................... H02J 7/0013 |

FOREIGN PATENT DOCUMENTS

| | | | | | |
|---|---|---|---|---|---|
| CN | 104330742 | A | | 2/2015 | |
| CN | 204721069 | U | | 10/2015 | |
| CN | 103650287 | B | * | 2/2017 | ........... G01R 31/362 |
| CN | 110350258 | A | | 10/2019 | |
| CN | 210881686 | U | | 6/2020 | |
| CN | 111934398 | A | | 11/2020 | |
| CN | 113169577 | A | * | 7/2021 | ................ H02J 3/32 |
| EP | 2149958 | B1 | * | 9/2015 | .......... H01M 10/425 |
| JP | 2012105431 | A | | 5/2012 | |

OTHER PUBLICATIONS

Written Opinion received in the corresponding International Application PCT/CN2021/114612, dated Oct. 15, 2021.
First Office Action received in the priority Chinese Application 202010987156.9, dated Nov. 20, 2020.
Notification to Grant Patent Right for Invention received in the priority Chinese Application 202010987156.9, dated Dec. 8, 2020.
First search report received in the priority Chinese Application 202010987156.9.
Supplementary search report received in the priority Chinese Application 202010987156.9.

* cited by examiner

BATTERY CHARGING CONTROL METHOD AND DEVICE

CROSS-REFERENCE TO RELATED APPLICATIONS

This application is a continuation application of PCT Patent Application No. PCT/CN2021/114612, entitled "BATTERY CHARGING CONTROL METHOD AND DEVICE" filed on Aug. 25, 2021, which claims priority to Chinese Patent Application No. 202010987156.9, filed with the State Intellectual Property Office of the People's Republic of China on Sep. 18, 2020, and entitled "BATTERY CHARGING CONTROL METHOD AND DEVICE", all of which are incorporated herein by reference in their entirety.

TECHNICAL FIELD

This application relates to the technical field of batteries, and in particular, to a battery charging control method and device.

BACKGROUND

With the development of new energy, new energy is used as power in more fields. Power batteries are widely used in new-energy battery electric vehicles by virtue of advantages such as a high energy density, rechargeability, safety, and environmental friendliness. However, in recent years, with the popularization and application of the power batteries, accidents caused by an internal short circuit of a battery during charging occur from time to time, for example, thermal runaway accidents caused by abrupt rise of battery temperature or smoke, fire, or even explosion of the battery, thereby posing a threat to personal safety and property safety of consumers.

Therefore, it is essential to effectively control a battery charging process and prevent thermal runaway.

SUMMARY

This application provides a battery charging control method and device to effectively control battery charging.

According to a first aspect, this application provides a battery charging control method, including: obtaining voltages of N cell units in an $M^{th}$ sampling period, where the $M^{th}$ sampling period includes K sampling moments, the N cell units form a battery, and N, M, and K are positive integers; calculating a voltage of the battery at each sampling moment among the K sampling moments based on the obtained voltages; and stopping charging the battery when both a first condition and a second condition are satisfied, where, the first condition includes: the voltage of the battery increases monotonically in the $M^{th}$ sampling period; and the second condition includes: a trend of a fitting curve of the voltage of at least one cell unit among the N cell units in the $M^{th}$ sampling period is non-rising.

For a battery that includes at least one cell unit, the charging of the battery is stopped in a case that, during charging, the voltage of the battery increases monotonically in the $M^{th}$ sampling period and that the trend of the fitting curve of the voltage of at least one cell unit in the $M^{th}$ sampling period is non-rising. Not only the change of the voltage of the battery in a sampling period is considered, but also the change of the voltage of the cell unit in the sampling period is considered. The charging of the battery can be stopped in time based on the voltage of the battery and the voltage of the cell unit when the change of the voltage is abnormal, thereby avoiding thermal runaway of the battery and effectively controlling the battery charging process.

In a practicable implementation, voltages of at least one cell unit among the N cell units in P consecutive sampling periods after the $M^{th}$ sampling period in the second condition are obtained, and the P consecutive sampling periods and the $M^{th}$ sampling period constitute P+1 consecutive sampling periods, where P is a positive integer. The second condition further includes: the trend of the fitting curve of the voltage of the at least one cell unit among the N cell units in each sampling period among the P consecutive sampling periods is non-rising.

The voltage of the cell unit in a plurality of consecutive sampling periods is judged, thereby avoiding impact brought by accidental factors such as voltage fluctuations and further increasing accuracy of battery charging control.

In some embodiments, when the fitting curve is a linear fitting curve, that the trend of the fitting curve in the second condition is non-rising includes: a slope of the linear fitting curve is less than or equal to 0, and that the trend of the fitting curve is rising includes: the slope of the linear fitting curve is greater than 0; or, when the fitting curve is an exponential fitting curve or a logarithmic fitting curve, that the trend of the fitting curve is non-rising includes: a base of the exponential fitting curve or the logarithmic fitting curve is greater than 0 and less than or equal to 1, and that the trend of the fitting curve is rising includes: the base of the exponential fitting curve or the logarithmic fitting curve is greater than 1.

In some embodiments, that the voltage of the battery increases monotonically in the $M^{th}$ sampling period specifically includes: a difference between the voltage of the battery at a $(j+1)^{th}$ sampling moment and the voltage of the battery at a $j^{th}$ sampling moment is greater than 0, where $1 \leq j \leq K-1$.

In some embodiments, the calculating a voltage of the battery at each sampling moment among the K sampling moments specifically includes: summing the voltages of the N cell units at an $i^{th}$ sampling moment to obtain the voltage of the battery at the $i^{th}$ sampling moment, where $1 \leq i \leq K$.

In some embodiments, a current of the battery at each sampling moment among the K sampling moments is obtained. Charging of the battery is continued when both the first condition and a third condition are satisfied. The third condition includes: the trend of the fitting curve of the voltage of each of the N cell units in the $M^{th}$ sampling period is rising.

In some embodiments, a current of the battery at each sampling moment among the K sampling moments is obtained. Charging of the battery is stopped when the first condition is not satisfied but a fourth condition is satisfied. The fourth condition includes: a difference between a preset current and the current of the battery at each sampling moment among the K sampling moments is less than a preset threshold. The preset current is a preset value of the battery in the $M^{th}$ sampling period.

When a charge current of the battery is switched, the voltage of the battery will also fluctuate accordingly due to electrochemical characteristics of the battery. If the current of the battery is not switched and the voltage of the battery does not increase monotonically, the battery is at risk of thermal runaway in this case. By detecting the current of the battery, the battery charging process can be effectively controlled.

In some embodiments, the current of the battery at each sampling moment among the K sampling moments is obtained. Charging of the battery is continued when the first condition is not satisfied but a fifth condition is satisfied. The fifth condition includes: a difference between a preset current and the current of the battery on at least one sampling moment among the K sampling moments is greater than a preset threshold.

According to a second aspect, this application provides a battery charging control device. The device includes: an obtaining module, configured to obtain voltages of N cell units in an $M^{th}$ sampling period. The $M^{th}$ sampling period includes K sampling moments, the N cell units form a battery, and N, M, and K are positive integers. The obtaining module is further configured to calculate a voltage of the battery at each sampling moment among the K sampling moments based on the obtained voltages. The processing module is configured to stop charging the battery when both a first condition and a second condition are satisfied. The first condition includes: the voltage of the battery increases monotonically in the $M^{th}$ sampling period. The second condition includes: a trend of a fitting curve of the voltage of at least one cell unit among the N cell units in the $M^{th}$ sampling period is non-rising.

For a battery that includes at least one cell unit, the processing module stops charging the battery in a case that, during charging, the voltage of the battery increases monotonically in the $M^{th}$ sampling period and that the trend of the fitting curve of the voltage of at least one cell unit in the $M^{th}$ sampling period is non-rising. Not only the change of the voltage of the battery in a sampling period is considered, but also the change of the voltage of the cell unit in the sampling period is considered. The charging of the battery can be stopped in time based on the voltage of the battery and the voltage of the cell unit when the change of the voltage is abnormal, thereby avoiding thermal runaway of the battery and effectively controlling the battery charging process.

In some embodiments, the obtaining module obtains voltages of at least one cell unit in P consecutive sampling periods after the $M^{th}$ sampling period. The P consecutive sampling periods and the $M^{th}$ sampling period constitute P+1 consecutive sampling periods, where P is a positive integer. The processing module is specifically configured to: stop charging the battery when both the first condition and the second condition are satisfied. The second condition further includes: the trend of the fitting curve of the voltage of the at least one cell unit among the N cell units in each sampling period among the P consecutive sampling periods is non-rising.

The processing module judges the voltage of the cell unit in a plurality of consecutive sampling periods, thereby avoiding impact brought by accidental factors such as voltage fluctuations and further increasing accuracy of battery charging control.

In some embodiments, the processing module stops charging the battery when both the first condition and the second condition are satisfied. When the fitting curve in the second condition is a linear fitting curve, that the trend of the fitting curve is non-rising includes: a slope of the linear fitting curve is less than or equal to 0, and that the trend of the fitting curve is rising includes: the slope of the linear fitting curve is greater than 0; or, when the fitting curve is an exponential fitting curve or a logarithmic fitting curve, that the trend of the fitting curve is non-rising includes: a base of the exponential fitting curve or the logarithmic fitting curve is greater than 0 and less than or equal to 1, and that the trend of the fitting curve is rising includes: the base of the exponential fitting curve or the logarithmic fitting curve is greater than 1.

In some embodiments, the processing module is configured to: determine, when a difference between the voltage of the battery at a $(j+1)^{th}$ sampling moment and the voltage of the battery at a $j^{th}$ sampling moment is greater than 0 throughout the $M^{th}$ sampling period, that the voltage of the battery increases monotonically in the $M^{th}$ sampling period, where $1 \leq j \leq K-1$.

In some embodiments, the obtaining module is specifically configured to: sum the voltages of the N cell units at an $i^{th}$ sampling moment among the K sampling moments to obtain the voltage of the battery at the $i^{th}$ sampling moment among the K sampling moments, where $1 \leq i \leq K$.

In some embodiments, the obtaining module is further configured to obtain a current of the battery at each sampling moment among the K sampling moments. The processing module is further configured to: continue charging the battery when both the first condition and a third condition are satisfied. The third condition includes: the trend of the fitting curve of the voltage of each of the N cell units in the $M^{th}$ sampling period is rising.

In some embodiments, the obtaining module is further configured to obtain a current of the battery at each sampling moment among the K sampling moments. The processing module is further configured to stop charging the battery when the first condition is not satisfied but a fourth condition is satisfied. The fourth condition includes: a difference between a preset current and the current of the battery at each sampling moment among the K sampling moments is less than a preset threshold, where the preset current is a preset value of the battery in the $M^{th}$ sampling period.

When a charge current of the battery is switched, the voltage of the battery will also fluctuate accordingly due to electrochemical characteristics of the battery. If the processing module detects that the current of the battery is not switched and the voltage of the battery does not increase monotonically, the processing module stops charging the battery in a case of thermal runaway. By detecting the current of the battery obtained by the obtaining module, the processing module can effectively control the battery charging process.

In some embodiments, the processing module is configured to: continue charging the battery when the first condition is not satisfied but a fifth condition is satisfied. The fifth condition includes: a difference between a preset current and the current of the battery on at least one sampling moment among the K sampling moments is greater than a preset threshold.

According to a third aspect, this application further provides a battery charging control method, including: obtaining voltages of N cell units in an $M^{th}$ sampling period, where the sampling period includes K sampling moments, the N cell units form a battery, and N, M, and K are positive integers; calculating a voltage of the battery at each sampling moment among the K sampling moments based on the obtained voltages; obtaining a current of the battery at each sampling moment among K sampling moments; and stopping charging the battery when a first condition is not satisfied but a fourth condition is satisfied. The first condition includes: the voltage of the battery increases monotonically in the $M^{th}$ sampling period. The fourth condition includes: a difference between a preset current and the current of the battery at each sampling moment among the K sampling moments is less than a preset threshold, where the preset current is a preset value of the battery in the $M^{th}$ sampling period.

For a battery that includes at least one cell unit, the charging of the battery is stopped in a case that, during charging, the voltage of the battery increases monotonically in the $M^{th}$ sampling period and that the trend of the fitting curve of the voltage of at least one cell unit in the $M^{th}$ sampling period is non-rising. Not only the change of the voltage of the battery in a sampling period is considered, but also the change of the voltage of the cell unit in the sampling period is considered. The charging of the battery can be stopped in time based on the voltage of the battery and the voltage of the cell unit when the change of the voltage is abnormal, thereby avoiding thermal runaway of the battery. When a charge current of the battery is switched, the voltage of the battery will also fluctuate accordingly due to electrochemical characteristics of the battery. If the voltage of the battery does not increase monotonically and the current of the battery is not switched, the battery is at risk of thermal runaway in this case. By detecting the current of the battery, the battery charging process can be effectively controlled.

In some embodiments, the method includes: continuing charging the battery when the first condition is not satisfied but a fifth condition is satisfied. The fifth condition includes: a difference between a preset current and the current of the battery on at least one sampling moment among the K sampling moments is greater than a preset threshold.

According to a fourth aspect, this application provides a battery charging control device, including: an obtaining module, configured to obtain voltages of N cell units in an $M^{th}$ sampling period, where the $M^{th}$ sampling period includes K sampling moments, the N cell units form a battery, and N, M, and K are positive integers; an obtaining module, configured to: calculate a voltage of the battery at each sampling moment among the K sampling moments based on the obtained voltages, and obtain a current of the battery at each sampling moment among K sampling moments; and a processing module, configured to stop charging the battery when a first condition is not satisfied but a fourth condition is satisfied, where the first condition includes: the voltage of the battery increases monotonically in the $M^{th}$ sampling period, and the fourth condition includes: a difference between a preset current and the current of the battery at each sampling moment among the K sampling moments is less than a preset threshold.

For a battery that includes at least one cell unit, the processing module stops charging the battery in a case that, during charging, the voltage of the battery increases monotonically in the $M^{th}$ sampling period and that the trend of the fitting curve of the voltage of at least one cell unit in the $M^{th}$ sampling period is non-rising. Not only the change of the voltage of the battery in a sampling period is considered, but also the change of the voltage of the cell unit in the sampling period is considered. The charging of the battery can be stopped in time based on the voltage of the battery and the voltage of the cell unit when the change of the voltage is abnormal, thereby avoiding thermal runaway of the battery. When a charge current of the battery is switched, the voltage of the battery will also fluctuate accordingly due to electrochemical characteristics of the battery. If the processing module detects that the current of the battery is not switched and the voltage of the battery does not increase monotonically, the processing module stops charging the battery in a case of thermal runaway. By detecting the current of the battery obtained by the obtaining module, the processing module can effectively control the battery charging process.

In some embodiments, the processing module is configured to: continue charging the battery when the first condition is not satisfied but a fifth condition is satisfied. The fifth condition includes: a difference between a preset current and the current of the battery on at least one sampling moment among the K sampling moments is greater than a preset threshold.

BRIEF DESCRIPTION OF DRAWINGS

To describe technical solutions of this application more clearly, the following outlines the drawings to be used in this application. A person of ordinary skill in the art may derive other drawings from the drawings without making any creative efforts.

DETAILED DESCRIPTION OF EMBODIMENTS

Figure 1:
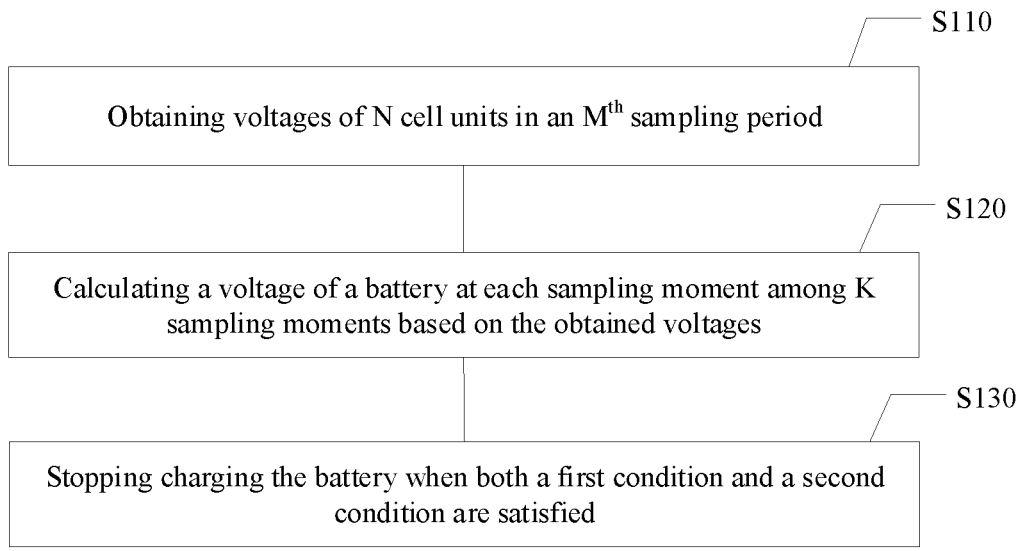
FIG. 1 is a schematic flowchart of a battery charging control method according to Embodiment 1 of this application.

The following describes features and exemplary embodiments in detail according to each aspect of this application. In the following detailed description, many details are provided to enable a comprehensive understanding of this application. However, it is apparent to a person skilled in the art that this application can be implemented without some of the details. The following description of the embodiments is merely intended to enable a better understanding of this application by illustrating examples of this application. This application is not limited to any undermentioned specific configurations or algorithms in any way, but covers any modification, replacement, and improvement of elements, components, and algorithms to the extent of not departing from the spirit of this application. In the drawings and the following description, well known structures and technologies are omitted to avoid unnecessary ambiguity caused to this application.

It needs to be noted that the relational terms herein such as first and second are used only to differentiate an entity or operation from another entity or operation, and do not require or imply any actual relationship or sequence between the entities or operations. Moreover, the terms "include", "comprise", and any variation thereof are intended to cover a non-exclusive inclusion relationship in which a process, method, object, or device that includes or comprises a series of elements not only includes such elements, but also includes other elements not expressly specified or also includes inherent elements of the process, method, object, or device. Unless otherwise specified in the context, reference to a process, method, object, or device that "includes" or "comprises" a specific number of elements does not exclude other equivalent elements existent in the process, method, object, or device.

In an electric vehicle and an energy storage device, a battery is a source of power to the vehicle or the device. Generally, a power battery includes several cell units connected in series and in parallel. Electrochemical performance of the power battery is complex and the number of cell units is relatively large, a battery management system (BMS) is required to serve as a link between the battery and a user, and serves to detect the entire battery and status parameters of the cell units such as voltage, current, and temperature, and analyzes and judges detection data to improve a utilization rate of the battery, monitor usage status of the battery, prevent safety problems such as thermal runaway of the battery, and prolong a service life of the battery.

Currently, in a battery charging process, the battery management system can take corresponding measures against thermal runaway caused by overcharge. If abnormality such as a micro short circuit or a short circuit occurs inside a cell unit of the battery, thermal runaway of the battery may still occur during charging because sparks generated by the expansion and short circuit of the cell may instantly ignite an electrolytic solution inside the cell. For the thermal runaway that is not caused by overcharge, because the current, voltage, or temperature of the battery does not incur overcurrent, overvoltage, or overtemperature before the failure of the battery, the BMS is not triggered to handle thermal runaway.

In view of the foregoing, this application provides a battery charging control method and device, so that the BMS can effectively control the battery charging process in a case of no overcharge, and prevent thermal runaway of the battery.

The battery in the embodiments of this application may be a battery in an energy storage device, or may be a power battery in an electric vehicle. The battery may be a lithium iron phosphate battery or a ternary battery, without being limited herein. The battery in the embodiments of this application includes N cell units, where N is a positive integer. With respect to a cell unit in the embodiments of this application, the cell unit may mean a cell or a battery module compounded of a plurality of cells connected in series, or the like. The N cell units form a battery, and the battery may be formed by connecting a plurality of cell units in series. The embodiments of this application do not limit the specific form of the cell unit.

FIG. 1 is a schematic flowchart of a battery charging control method according to Embodiment 1 of this application. As shown in FIG. 1, the battery charging control method according to this embodiment may include steps S110 to S130.

S110. Obtaining voltages of N cell units in an $M^{th}$ sampling period.

The BMS obtains a voltage of a cell unit through voltage sampling, and can obtain the voltages of the N cell units concurrently at one sampling moment. One sampling period may include one or more sampling moments. That is, in a sampling period, such as the $M^{th}$ sampling period, the voltages of the N cell units at K sampling moments in the sampling period can be obtained by sampling, where K is a positive integer.

S120. Calculating a voltage of a battery at each sampling moment among K sampling moments based on the obtained voltages.

A battery includes N cell units connected in series. Therefore, the voltage of the battery is a sum of the voltages of the N cell units included in the battery. The BMS calculates and obtains the voltage of the battery at each sampling moment in the sampling period based on the voltage of each cell unit at each sampling moment among the K sampling moments in the $M^{th}$ sampling period.

In some embodiments, the voltages of the N cell units at an $i^{th}$ sampling moment are summed to obtain the voltage of the battery at the $i^{th}$ sampling moment, where $1 \leq i \leq K$.

S130. Stopping charging the battery when both a first condition and a second condition are satisfied.

The first condition includes: the voltage of the battery increases monotonically in the $M^{th}$ sampling period.

The second condition includes: a trend of a fitting curve of the voltage of at least one cell unit among the N cell units in the $M^{th}$ sampling period is non-rising.

During charging, the BMS obtains the voltages of the cell units by sampling, and calculates the voltage of the battery in the sampling period. The BMS stops charging the battery if the voltage of the battery increases monotonically in the sampling period and a change trend of the voltage of at least one cell unit in the sampling period is non-rising. The foregoing technical solution can effectively control the battery charging and avoid thermal runaway of the battery.

In some embodiments, if the voltage of the battery increases monotonically in a sampling period and the change trend of the voltage of at least one cell unit in the sampling period is non-rising, the BMS determines that the cell unit is at risk of thermal runaway, and marks the cell unit as an abnormal cell unit.

In some embodiments, if a difference between the voltage of the battery at a $(j+1)^{th}$ sampling moment and the voltage of the battery at a $j^{th}$ sampling moment is greater than 0 throughout the $M^{th}$ sampling period, the BMS determines that the voltage of the battery increases monotonically in the $M^{th}$ sampling period, where $1 \leq j \leq K-1$.

In some embodiments, in order to obtain the change trend of the voltage of the cell unit in the sampling period, the BMS may perform fitting, such as linear fitting, exponential fitting, or logarithmic fitting, on the voltage of the cell unit in the $M^{th}$ sampling period. Based on characteristics of the fitting curve, the BMS obtains the change trend of the voltage of the cell unit in the sampling period.

For linear fitting (that is, the voltage of the cell unit in the $M^{th}$ sampling period is linearly fitted), if a slope of a linear fitting curve is less than or equal to 0, the trend of the linear fitting curve is non-rising. Conversely, if the slope is greater than 0, the trend of the linear fitting curve is rising.

Specifically, the BMS establishes a two-dimensional data group for each sampling moment in the $M^{th}$ sampling period and the voltage of the cell unit corresponding to the sampling moment, and solves the data group by a least square method to obtain a slope value of a linear regression equation of each cell unit in the sampling period. For any cell unit, if the slope value of the linear fitting curve of the cell unit is less than or equal to 0, it indicates that the trend of the linear fitting curve is unchanged or falling, that is, the trend of the linear fitting curve of the cell unit in the $M^{th}$ sampling period is non-rising. Conversely, if the slope value is greater than 0, the trend of the linear fitting curve of the cell unit in the $M^{th}$ sampling period is rising.

For exponential fitting or logarithmic fitting, if the base of an exponential fitting curve or a logarithmic fitting curve is greater than 0 and less than or equal to 1, the trend of the fitting curve is non-rising; if the base of the exponential fitting curve or the logarithmic fitting curve is greater than 1, the trend of the exponential or logarithmic fitting curve is rising.

Specifically, for exponential fitting, the BMS establishes a two-dimensional data group for a sampling moment in the $M^{th}$ sampling period and the voltage of the cell unit corresponding to the sampling moment, and solves the data group by the least square method to obtain a base of an exponential regression equation of each cell unit in the sampling period. For any cell unit, if the base of the fitting curve of the cell unit is greater than 0 and less than or equal to 1, it indicates that the trend of the exponential fitting curve is unchanged or falling, that is, the trend of the exponential fitting curve of the cell unit in the $M^{th}$ sampling period is non-rising. Conversely, if the base of the exponential fitting curve of the cell unit is greater than 1, the trend of the exponential fitting curve of the cell unit in the $M^{th}$ sampling period is rising.

Similarly, for logarithmic fitting, the BMS establishes a two-dimensional data group for a sampling moment in the $M^{th}$ sampling period and the voltage of the cell unit corresponding to the sampling moment, and solves the data group by the least square method to obtain a base of a logarithmic regression equation of each cell unit. For any cell unit, if the base of the logarithmic fitting curve of the cell unit is greater than 0 and less than or equal to 1, it indicates that the trend of the logarithmic fitting curve is unchanged or falling, that is, the trend of the logarithmic fitting curve of the cell unit in the $M^{th}$ sampling period is non-rising. Conversely, if the base of the logarithmic fitting curve of the cell unit is greater than 1, the trend of the logarithmic fitting curve of the cell unit in the $M^{th}$ sampling period is rising.

For the N cell units of the battery, the charging of the battery is stopped if the trend of the fitting curve of the voltage of at least one cell unit in the $M^{th}$ sampling period is non-rising and the voltage of the battery increases monotonically in the $M^{th}$ sampling period.

In some embodiments, to avoid the impact caused by voltage fluctuations, the BMS may perform fitting on the voltage of the at least one cell unit in each sampling period among a plurality of consecutive sampling periods. It needs to be noted that each sampling period includes K sampling moments. In each of the $M^{th}$ sampling period, the $(M+1)^{th}$ sampling period, and so on, and the $(M+P)^{th}$ sampling period, the trend of the fitting curve of the voltage of at least one cell unit among the N cell units is obtained. Specifically, the voltages of the at least one cell unit at each sampling moment in P consecutive sampling periods after the $M^{th}$ sampling period are obtained. The P consecutive sampling periods and the $M^{th}$ sampling period constitute P+1 consecutive sampling periods, where P is a positive integer.

The charging of the battery is stopped if the voltage of the battery increases monotonically in the $M^{th}$ sampling period and the trend of the fitting curve of the voltage of the at least one cell unit among the N cell units in each sampling period among the P+1 consecutive sampling periods is non-rising.

In some embodiments, P is equal to 2. That is, the voltage of the at least one cell unit is fitted in 3 consecutive sampling periods, thereby avoiding the impact caused by voltage fluctuations onto precision and simplifying the algorithm.

In some embodiments, the BMS judges the voltage of the battery in a plurality of consecutive sampling periods. In each of the $M^{th}$ sampling period, the $(M+1)^{th}$ sampling period, and so on, and the $(M+P)^{th}$ sampling period, the BMS obtains the voltage of the battery at each sampling moment. The BMS stops charging the battery if the voltage of the battery increases monotonically in each of the foregoing sampling periods and the trend of the fitting curve of the voltage of the at least one cell unit among the N cell units of the battery in each sampling period among the P+1 consecutive sampling periods is non-rising. That is, the BMS stops charging the battery if, in each sampling period among the P+1 consecutive sampling periods, the voltage of the battery increases monotonically and the trend of the fitting curve of the voltage of at least one cell unit among the N cell units of the battery is non-rising.

In some embodiments, for each of the $M^{th}$ sampling period, the $(M+1)^{th}$ sampling period, and so on, and the $(M+P)^{th}$ sampling period, the BMS may fit the voltage data of the cell unit linearly, logarithmically, or exponentially.

In some embodiments, the BMS may fit the voltage of the at least one cell unit in a plurality of consecutive sampling periods. Using the $M^{th}$ sampling period, the $(M+1)^{th}$ sampling period, and so on, and the $(M+P)^{th}$ sampling period as a combined sampling period, the BMS obtains the trend of the fitting curve of the voltage of the at least one cell unit in the combined sampling period. The BMS stops charging the battery if the voltage of the battery increases monotonically in the combined sampling period and the trend of the fitting curve of the voltage of at least one cell unit among the N cell units in the combined sampling period is non-rising.

The foregoing technical solutions can be combined freely to an extent reasonable, without being limited by this application. In some embodiments, P is equal to 2, thereby avoiding the impact caused by voltage fluctuations onto precision and simplifying the algorithm.

In some embodiments, the BMS continues charging the battery when both the first condition and a third condition are satisfied. The third condition includes: the trend of the fitting curve of the voltage of each of the N cell units of the battery in the $M^{th}$ sampling period is rising.

In some embodiments, the BMS obtains the current of the battery at each sampling moment among the K sampling moments, and stops charging the battery when the first condition is not satisfied but a fourth condition is satisfied. The fourth condition includes: the difference between the preset current and the current of the battery at each sampling moment among the K sampling moments is less than the preset threshold.

With respect to the fourth condition, a battery charging method in this embodiment of this application is constant-current charging. That is, a charging process is divided into several charging stages, a charge current remains constant in each charging stage, and the voltage of the battery increases with time. The BMS stops charging the battery if the voltage of the battery drops in a sampling period, that is, the voltage does not increase monotonically, and if both the preset current and the current value of the battery at each sampling moment in the sampling period are less than a preset threshold, indicating that the battery is not switched to a next charging stage at this time. The voltage drop is an abnormal phenomenon, and leaves the battery to be at risk of thermal runaway. Both the preset current and the preset threshold are set by the BMS. The foregoing technical solution can effectively control the battery charging process and avoid thermal runaway of the battery.

In some embodiments, the preset threshold may be 20% of the preset current.

In some embodiments, charging of the battery is continued when the first condition is not satisfied but a fifth condition is satisfied. The fifth condition includes: a difference between a preset current and the current of the battery on at least one sampling moment among the K sampling moments is greater than a preset threshold.

For ease of description, the following gives a description by using one sampling period as an example. In this example, the battery includes 8 cell units, and the sampling period includes 10 sampling moments. It is assumed that an interval between two adjacent sampling moments is 1 second. That is, the BMS obtains the voltage of the cell unit once every 1 second.

The BMS samples the voltages of all cell units at each sampling moment. For this sampling period, the BMS can obtain the voltage data of 8 cell units at 10 sampling moments, expressed as follows:

$$\begin{pmatrix} V_{1,1} & \cdots & V_{1,10} \\ \vdots & \ddots & \vdots \\ V_{8,1} & \cdots & V_{8,10} \end{pmatrix}$$

In a subscript in the expression above, the first numeral represents a serial number of the cell unit, and the second numeral represents a sampling moment.

The BMS calculates the voltage of the battery at each sampling moment among 10 sampling moments based on the foregoing voltage data. That is, for the first sampling moment, the BMS sums $V_{1,1}$, $V_{2,1}$, ..., $V_{8,1}$ to obtain $V_1$, that is, the voltage of the battery at the first sampling moment. Similarly, the voltages of the battery, $V_2$ to $V_{10}$, at remaining 9 sampling moments can be calculated.

The BMS subtracts the voltage of the battery at a $j^{th}$ sampling moment from the voltage of the battery at a $(j+1)^{th}$ sampling moment ($1 \leq j \leq 9$) to obtain a difference. If the voltage difference between every two adjacent sampling moments is greater than 0, it is determined that the voltage of the battery increases monotonically in the sampling period.

The BMS establishes a two-dimensional data group $Q_1 = (x_1, V_1), (x_2, V_2), \ldots, (x_{10}, V_{10})$ for the voltage of the first cell unit in the sampling period and a corresponding sampling moment, where $x_i$ ($i=1, 2, \ldots, n$) is the sampling moment. The BMS solves the data group $Q_1$ by the least square method to obtain a slope value of a linear regression equation, and similarly, obtain the slope value of the corresponding linear regression equation of each of the remaining 7 cell units in the sampling period. If the slope value of the linear regression equation of at least one cell unit (for example, the $2^{nd}$ cell unit, or the $2^{nd}$ and $3^{rd}$ cell units) is less than or equal to 0, the BMS determines that the battery is at risk of thermal runaway and stops charging the battery.

To avoid the impact caused by voltage fluctuations, the BMS may perform linear fitting on the voltage of the at least one cell unit in 3 consecutive sampling periods. Assuming that the slope value of the voltage fitting curve of the cell unit in 3 consecutive sampling periods is less than or equal to 0, the BMS determines that the battery is at risk of thermal runaway and stops charging the battery.

In order to improve accuracy of the judgment, a plurality of consecutive sampling periods, for example, 3 consecutive sampling periods, may be judged. The processing of each of the plurality of consecutive sampling periods is the same as the processing of the foregoing one sampling period, and is omitted here.

Figure 2:
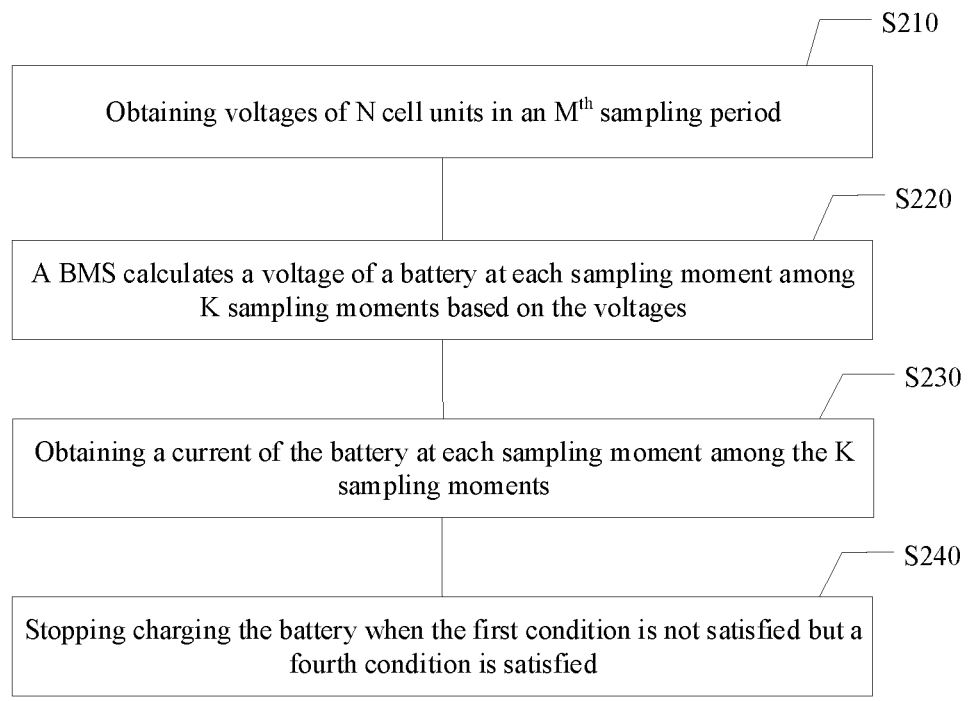
FIG. 2 is a schematic flowchart of a battery charging control method according to Embodiment 2 of this application.

FIG. 2 is a schematic flowchart of a battery charging control method according to Embodiment 2 of this application; As shown in FIG. 2, the battery charging control method according to this embodiment may include steps S210 to S240.

S210. Obtaining voltages of N cell units in an $M^{th}$ sampling period.

It needs to be noted that, for the specific content of this step, reference may be made to the related description of step S110 in Embodiment 1 of this application, and details are omitted here.

S220. A BMS calculates a voltage of a battery at each sampling moment among K sampling moments based on the voltages.

It needs to be noted that, for the specific content of this step, reference may be made to the related description of step S120 in Embodiment 1 of this application, and details are omitted here.

S230. Obtaining a current of the battery at each sampling moment among the K sampling moments.

The BMS obtains the current of the battery at each sampling moment in the $M^{th}$ sampling period.

S240. Stopping charging the battery when a first condition is not satisfied but a fourth condition is satisfied.

The first condition includes: the voltage of the battery increases monotonically in the $M^{th}$ sampling period.

The fourth condition includes: a difference between a preset current in the $M^{th}$ sampling period and the current of the battery at each sampling moment among the K sampling moments is less than a preset threshold.

With respect to the fourth condition, a battery charging method in this embodiment of this application is constant-current charging. That is, a charging process is divided into several charging stages, a charge current remains constant in each charging stage, and the voltage of the battery increases with time. The BMS stops charging the battery if the voltage of the battery drops in a sampling period, that is, the voltage does not increase monotonically, and if both the preset current and the current value of the battery at each sampling moment in the sampling period are less than a preset threshold, indicating that the battery is not switched to a next charging stage at this time. The voltage drop is an abnormal phenomenon, and leaves the battery to be at risk of thermal runaway. Both the preset current and the preset threshold are set by the BMS. The foregoing technical solution can effectively control the battery charging and avoid thermal runaway of the battery.

In some embodiments, the preset threshold may be 20% of the preset current.

In some embodiments, to avoid the impact caused by voltage fluctuations, the BMS may judge the current of the battery in each sampling period among a plurality of consecutive sampling periods. It needs to be noted that each sampling period includes K sampling moments. In each of the $M^{th}$ sampling period, the $(M+1)^{th}$ sampling period, and so on, and the $(M+P)^{th}$ sampling period, the BMS obtains the current of the battery. Specifically, the current of the battery at each sampling moment in P consecutive sampling periods after the $M^{th}$ sampling period is obtained. The P consecutive sampling periods and the $M^{th}$ sampling period constitute P+1 consecutive sampling periods, where P is a positive integer.

If the voltage of the battery does not increase monotonically in each sampling period, and the difference between the preset current and the current of the battery at each sampling moment in the P+1 consecutive sampling periods is less than the preset threshold, the BMS stops charging the battery.

In some embodiments, P is equal to 2. That is, the BMS obtains the current of the battery in 3 consecutive sampling periods, calculates the difference between the preset current and the current of the battery at each sampling moment, and compares the difference with the preset threshold, thereby avoiding the impact caused by voltage fluctuations onto precision and simplifying the algorithm.

In some embodiments, the BMS may judge the current of the battery in a plurality of consecutive sampling periods. Using the $M^{th}$ sampling period, the $(M+1)^{th}$ sampling period, and so on, and the $(M+P)^{th}$ sampling period as a combined sampling period, the BMS obtains a difference between the preset current and the current of the battery at each sampling moment in the combined sampling period. If the voltage of the battery increases monotonously in the combined sampling period, and the difference is less than the preset threshold, the BMS stops charging the battery.

The foregoing technical solutions can be combined freely to an extent reasonable, without being limited by this application. In some embodiments, P is equal to 2, thereby avoiding the impact caused by current fluctuations onto precision and simplifying the algorithm.

In some embodiments, the BMS continues charging the battery when the first condition is not satisfied but a fifth condition is satisfied. The fifth condition includes: a difference between a preset current in the $M^{th}$ sampling period and the current of the battery on at least one sampling moment among the K sampling moments is greater than a preset threshold.

Figure 3:
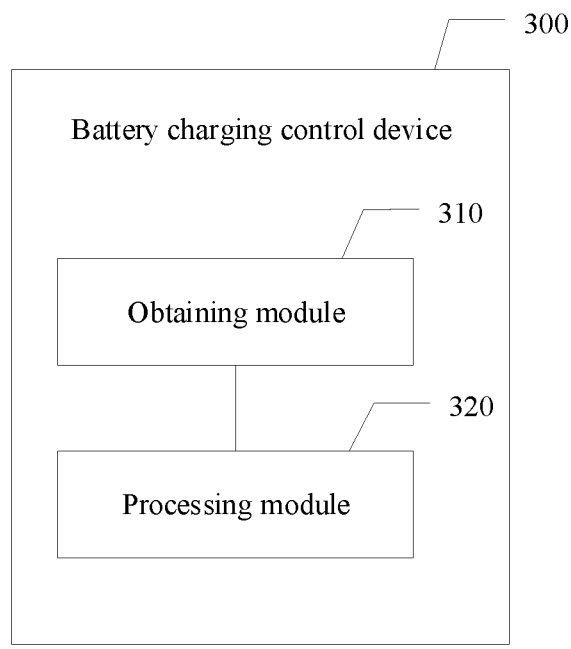
FIG. 3 is a schematic structural diagram of a battery charging control device according to Embodiment 3 of this application.

A battery charging control device is provided in Embodiment 3 of this application, and is configured to implement the charging control method disclosed in the foregoing embodiment. FIG. 3 is a schematic structural diagram of a battery charging control device according to Embodiment 3 of this application;

As shown in FIG. 3, the battery charging control device 300 includes an obtaining module 310 and a processing module 320.

It needs to be noted that, the battery charging control device 300 in this embodiment of this application may be a device that possesses independent functions, or may be integrated in a BMS, without being limited herein.

The obtaining module 310 is configured to obtain voltages of N cell units in an $M^{th}$ sampling period.

The obtaining module 310 obtains a voltage of a cell unit, and can obtain the voltages of the N cell units of the battery concurrently at one sampling moment. One sampling period may include one or more sampling moments. That is, in a sampling period, such as the $M^{th}$ sampling period, the voltages of the N cell units at K sampling moments in the sampling period can be obtained by sampling, where K is a positive integer.

The obtaining module 310 is further configured to calculate a voltage of the battery at each sampling moment among the K sampling moments based on the voltages.

A battery includes N cell units connected in series. Therefore, the voltage of the battery is a sum of the voltages of the N cell units included in the battery. The obtaining module 310 calculates and obtains the voltage of the battery at each sampling moment in the sampling period based on the voltage of each cell unit at each sampling moment among the K sampling moments in the $M^{th}$ sampling period.

In some embodiments, the obtaining module 310 is configured to sum the voltages of the N cell units at an $i^{th}$ sampling moment to obtain the voltage of the battery at the $i^{th}$ sampling moment, where $1 \leq i \leq K$.

The processing module 320 is configured to stop charging the battery when both a first condition and a second condition are satisfied. The first condition includes: the voltage of the battery increases monotonically in the $M^{th}$ sampling period. The second condition includes: a trend of a fitting curve of the voltage of at least one cell unit among the N cell units in the $M^{th}$ sampling period is non-rising.

In a battery charging process, the voltage of the battery is calculated based on the voltages of the cell units inside the battery. When it is determined that the voltage of the battery increases monotonically in a sampling period, if the change trend of the voltage of some cell units in the sampling period is non-rising, a possible reason is that a short circuit occurs inside such cell units. The voltage of each cell unit is fitted to obtain a fitting curve to detect the change trend of the voltage. When an abnormality occurs, a battery charging circuit is cut off to stop charging the battery, thereby effectively control the battery charging process.

In some embodiments, the processing module 320 is further configured to judge a difference between the voltage of the battery at a $(j+1)^{th}$ sampling moment and the voltage of the battery at a $j^{th}$ sampling moment. If the difference is greater than 0 throughout the $M^{th}$ sampling period, the processing module 320 determines that the voltage of the battery increases monotonically in the $M^{th}$ sampling period, where $1 \leq j \leq K-1$.

In some embodiments, in order to obtain the change trend of the voltage of the cell unit in the sampling period, the processing module 320 may perform fitting, such as linear fitting, exponential fitting, or logarithmic fitting, on the voltage of the cell unit in the $M^{th}$ sampling period.

Based on characteristics of the fitting curve, the processing module 320 obtains the change trend of the voltage of the cell unit in the sampling period.

For linear fitting (that is, the voltage of the cell unit in the $M^{th}$ sampling period is linearly fitted), if a slope of a linear fitting curve is less than or equal to 0, the trend of the linear fitting curve is non-rising. Conversely, if the slope is greater than 0, the trend of the linear fitting curve is rising.

For exponential fitting and logarithmic fitting, if the base of an exponential fitting curve or a logarithmic fitting curve is greater than 0 and less than or equal to 1, the trend of the fitting curve is non-rising; and, conversely, if the base of the exponential fitting curve or the logarithmic fitting curve is greater than 1, the trend of the exponential or logarithmic fitting curve is rising.

For the N cell units of the battery, the processing module 320 makes a judgment, and stops charging the battery if the trend of the fitting curve of the voltage of at least one cell unit in the $M^{th}$ sampling period is non-rising and the voltage of the battery increases monotonically in the $M^{th}$ sampling period.

In some embodiments, to avoid the impact caused by voltage fluctuations, the processing module 320 may fit the voltage of the at least one cell unit in a plurality of consecutive sampling periods.

In some embodiments, P is equal to 2. That is, the processing module 320 fits the voltage of the at least one cell unit in 3 consecutive sampling periods, thereby avoiding the impact caused by voltage fluctuations onto precision and simplifying the algorithm.

In some embodiments, for each of the $M^{th}$ sampling period, the $(M+1)^{th}$ sampling period, and so on, and the $(M+P)^{th}$ sampling period, the processing module 320 may fit the voltage data of the cell unit linearly, logarithmically, or exponentially.

In some embodiments, the processing module 320 may be configured to fit the voltage of the at least one cell unit in a plurality of consecutive sampling periods. Using the $M^{th}$ sampling period, the $(M+1)^{th}$ sampling period, and so on, and the $(M+P)^{th}$ sampling period as a combined sampling period, the processing module obtains the trend of the fitting curve of the voltage of the at least one cell unit in the combined sampling period.

The processing module stops charging the battery if the voltage of the battery increases monotonically in the combined sampling period and the trend of the fitting curve of the voltage of at least one cell unit among the N cell units in the combined sampling period is non-rising.

In some embodiments, the obtaining module 310 is further configured to obtain a current of the battery at each sampling moment among the K sampling moments. The processing module 320 is further configured to: when the first condition and a third condition are satisfied, determine that the battery is normal, and continue charging the battery, where the third condition includes: the trend of the fitting curve of the voltage of the N cell units of the battery in the $M^{th}$ sampling period is rising.

In some embodiments, the obtaining module 310 is further configured to obtain the current of the battery at each sampling moment among the K sampling moments. The processing module 320 is further configured to stop charging the battery when the first condition is not satisfied but a fourth condition is satisfied. The fourth condition includes: a difference between a preset current in the $M^{th}$ sampling period and the current of the battery at each sampling moment among the K sampling moments is less than a preset threshold.

Figure 4:
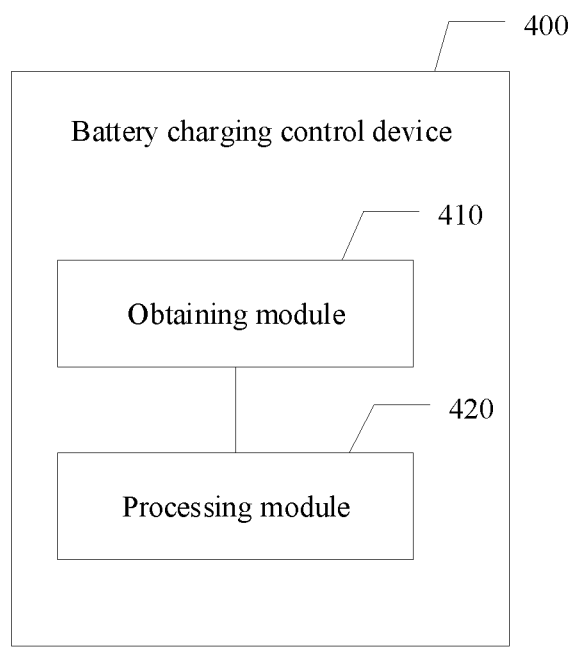
FIG. 4 is a schematic structural diagram of a battery charging control device according to Embodiment 4 of this application.

A battery charging control device is provided in Embodiment 4 of this application. FIG. 4 is a schematic structural diagram of a battery charging control device according to Embodiment 4 of this application; and As shown in FIG. 4, the battery charging control device 400 includes an obtaining module 410 and a processing module 420.

The obtaining module 410 is configured to obtain voltages of N cell units in an $M^{th}$ sampling period.

The obtaining module 410 obtains a voltage of a cell unit through voltage sampling, and can obtain the voltages of the N cell units of the battery concurrently at one sampling moment. One sampling period may include one or more (K) sampling moments. That is, in a sampling period, such as the $M^{th}$ sampling period, the voltages of the N cell units at each sampling moment can be obtained by sampling.

The obtaining module 410 is further configured to calculate a voltage of the battery at each sampling moment among the K sampling moments based on the voltages.

A battery includes N cell units. Therefore, the voltage of the battery is a sum of the voltages of the N cell units included in the battery. The obtaining module 410 calculates and obtains the voltage of the battery at each sampling moment in the sampling period based on the voltage of each cell unit at each sampling moment in the $M^{th}$ sampling period.

In some embodiments, the obtaining module 410 is configured to sum the voltages of the N cell units at an $i^{th}$ sampling moment to obtain the voltage of the battery at the $i^{th}$ sampling moment, where $1 \leq i \leq K$.

The obtaining module 410 is further configured to obtain a current of the battery at each sampling moment among the K sampling moments.

The processing module 420 is configured to stop charging the battery when a first condition is not satisfied but a fourth condition is satisfied.

The first condition includes: the voltage of the battery increases monotonically in the $M^{th}$ sampling period.

The fourth condition includes: a difference between a preset current in the $M^{th}$ sampling period and the current of the battery at each sampling moment among the K sampling moments is less than a preset threshold.

With respect to the fourth condition, a battery charging method in this embodiment of this application is constant-current charging. That is, a charging process is divided into several charging stages, a charge current remains constant in each charging stage, and the voltage of the battery increases with time. The battery charging control device stops charging the battery if the voltage of the battery drops in a sampling period, that is, the voltage does not increase monotonically, and if both the preset current and the current value of the battery at each sampling moment in the sampling period are less than a preset threshold, indicating that the battery is not switched to a next charging stage at this time. The voltage drop is an abnormal phenomenon, and leaves the battery to be at risk of thermal runaway. Both the preset current and the preset threshold are set by the battery charging control device 400. The foregoing technical solution can effectively control the battery charging and avoid thermal runaway of the battery.

In some embodiments, the preset threshold may be 20% of the preset current.

In some embodiments, to avoid the impact caused by voltage fluctuations, the processing module 420 may judge the current of the battery obtained by the obtaining module 410 in each sampling period among a plurality of consecutive sampling periods. It needs to be noted that each sampling period includes K sampling moments.

In some embodiments, the processing module 420 is further configured to make a judgment, and continue charging the battery when the first condition is not satisfied but a fifth condition is satisfied. The fifth condition includes: a difference between a preset current in the $M^{th}$ sampling period and the current of the battery on at least one sampling moment among the K sampling moments is greater than a preset threshold.

Figure 5:
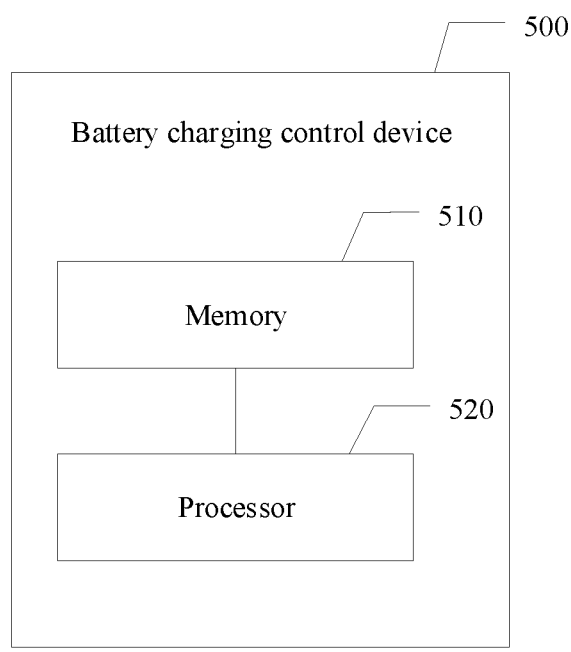
FIG. 5 is a schematic structural diagram of a battery charging control device according to Embodiment 5 of this application.

FIG. 5 is a schematic structural diagram of a battery charging control device according to Embodiment 5 of this application. As shown in FIG. 5, the battery charging control device 500 includes a memory 510 and a processor 520. The memory 510 is configured to store an instruction. The processor 520 is configured to perform the battery charging control method based on the instruction.

A readable storage medium is further provided in an embodiment of this application, and is configured to store a computer program. The computer program is configured to perform the battery charging control method.

Unless otherwise defined, all technical and scientific terms used herein have the same meanings as usually understood by a person skilled in the technical field of this application. The terms used in the specification of this application are merely intended for describing specific embodiments but are not intended to limit this application. The terms "include" and "contain" and any variations thereof used in the specification, claims, and brief description of drawings of this application are intended as non-exclusive inclusion. The terms such as "first" and "second" used in the specification, claims, and brief description of drawings of this application are intended to distinguish different objects, but are not intended to describe a specific sequence or order of priority.

Reference to "embodiment" in this application means that a specific feature, structure or characteristic described with reference to the embodiment may be included in at least one embodiment of this application. Reference to this term in different places in the specification does not necessarily represent the same embodiment, nor does it represent an independent or alternative embodiment in a mutually exclusive relationship with other embodiments. A person skilled in the art explicitly and implicitly understands that the embodiments described herein may be combined with other embodiments.

The term "and/or" in this application indicates merely a relation for describing the related objects, and represents three possible relationships. For example, "A and/or B" may represent the following three circumstances: A alone, both A and B, and B alone. In addition, the character "/" herein generally indicates an "or" relationship between the object preceding the character and the object following the character.

"A plurality of" referred to in this application means two or more (including two). Similarly, "a plurality of groups" means two or more groups (including two groups), and "a plurality of pieces" means two or more pieces (including two pieces).

The foregoing embodiments are merely intended to describe the technical solutions of this application but not to limit this application. Although this application is described in detail with reference to the foregoing embodiments, a person of ordinary skill in the art understands that modifications may still be made to the technical solutions described in the foregoing embodiments or equivalent replacements may be made to some technical features thereof.

What is claimed is:

1. A battery charging control method, comprising:
    obtaining voltages of N cell units in an $M^{th}$ sampling period, wherein the $M^{th}$ sampling period comprises K sampling moments, the N cell units form a battery, and N, M, and K are positive integers;
    calculating a voltage of the battery at each sampling moment among the K sampling moments based on the voltages of N cell units; and
    stopping charging the battery when both a first condition and a second condition are satisfied,
    wherein, the first condition comprises: the voltage of the battery increases monotonically in the $M^{th}$ sampling period; and
    the second condition comprises: a trend of a fitting curve of the voltage of at least one cell unit among the N cell units in the $M^{th}$ sampling period is non-rising.

2. The method according to claim 1, wherein the method further comprises:
    obtaining voltages of at least one cell unit among the N cell units in P consecutive sampling periods after the $M^{th}$ sampling period, wherein the P consecutive sampling periods and the $M^{th}$ sampling period constitute P+1 consecutive sampling periods, and P is a positive integer; and
    the second condition further comprises: the trend of the fitting curve of the voltage of the at least one cell unit among the N cell units in each sampling period among the P consecutive sampling periods is non-rising.

3. The method according to claim 1, wherein:
    when the fitting curve is a linear fitting curve, that the trend of the fitting curve is non-rising comprises: a slope of the linear fitting curve is less than or equal to 0; or
    when the fitting curve is an exponential fitting curve or a logarithmic fitting curve, that the trend of the fitting curve is non-rising comprises: a base of the exponential fitting curve or the logarithmic fitting curve is greater than 0 and less than or equal to 1.

4. The method according to claim 1, wherein, that the voltage of the battery increases monotonically in the $M^{th}$ sampling period comprises:
    a difference between the voltage of the battery at a $(j+1)^{th}$ sampling moment and the voltage of the battery at a $j^{th}$ sampling moment is greater than 0, wherein $1 \le j \le K-1$.

5. The method according to claim 1, wherein the calculating a voltage of the battery at each sampling moment among the K sampling moments comprises:
    summing the voltages of the N cell units at an $i^{th}$ sampling moment to obtain the voltage of the battery at the $i^{th}$ sampling moment, wherein $1 \le i \le K$.

6. The method according to claim 1, wherein the method further comprises:
    continuing charging the battery when both the first condition and a third condition are satisfied,
    wherein, the third condition comprises: the trend of the fitting curve of the voltage of each of the N cell units in the $M^{th}$ sampling period is rising.

7. The method according to claim 6, wherein:
    when the fitting curve is a linear fitting curve, that the trend of the fitting curve is rising comprises: a slope of the linear fitting curve is greater than 0; or
    when the fitting curve is an exponential fitting curve or a logarithmic fitting curve, that the trend of the fitting curve is rising comprises: a base of the exponential fitting curve or the logarithmic fitting curve is greater than 1.

8. The method according to claim 1, wherein the method further comprises:
    obtaining a current of the battery at each sampling moment among the K sampling moments;
    stopping charging the battery when the first condition is not satisfied but a fourth condition is satisfied,
    wherein, the fourth condition comprises: a difference between a preset current and the current of the battery at each sampling moment among the K sampling moments is less than a preset threshold, wherein the preset current is a preset value of the battery in the $M^{th}$ sampling period.

9. The method according to claim 8, wherein the method further comprises:
    continuing charging the battery when the first condition is not satisfied but a fifth condition is satisfied,
    wherein, the fifth condition comprises: the difference between the preset current and the current of the battery on at least one sampling moment among the K sampling moments is greater than the preset threshold.

10. A battery charging control device, comprising:
    an obtaining module, configured to obtain voltages of N cell units in an $M^{th}$ sampling period, wherein the $M^{th}$ sampling period comprises K sampling moments, the N cell units form a battery, and N, M, and K are positive integers, wherein
    the obtaining module is further configured to calculate a voltage of the battery at each sampling moment among the K sampling moments based on the voltages; and
    a processing module, configured to stop charging the battery when both a first condition and a second condition are satisfied,
    wherein, the first condition comprises: the voltage of the battery increases monotonically in the $M^{th}$ sampling period; and
    the second condition comprises: a trend of a fitting curve of the voltage of at least one cell unit among the N cell units in the $M^{th}$ sampling period is non-rising.

11. The device according to claim 10, wherein:
    the obtaining module is further configured to: obtain voltages of the at least one cell unit in P consecutive sampling periods after the $M^{th}$ sampling period, wherein the P consecutive sampling periods and the $M^{th}$ sampling period constitute P+1 consecutive sampling periods, and P is a positive integer; and
    the processing module is specifically configured to: stop charging the battery when both the first condition and the second condition are satisfied, wherein the second condition further comprises: the trend of the fitting curve of the voltage of the at least one cell unit among the N cell units in each sampling period among the P consecutive sampling periods is non-rising.

12. The device according to claim 10, wherein:
when the fitting curve is a linear fitting curve, that the trend of the fitting curve is non-rising comprises: a slope of the linear fitting curve is less than or equal to 0; or
when the fitting curve is an exponential fitting curve or a logarithmic fitting curve, that the trend of the fitting curve is non-rising comprises: a base of the exponential fitting curve or the logarithmic fitting curve is greater than 0 and less than or equal to 1.

13. The device according to claim 10, wherein the processing module is specifically configured to:
determine, when a difference between the voltage of the battery at a $(j+1)^{th}$ sampling moment and the voltage of the battery at a $j^{th}$ sampling moment is greater than 0 throughout the $M^{th}$ sampling period, that the voltage of the battery increases monotonically in the $M^{th}$ sampling period, wherein $1 \leq j \leq K-1$.

14. The device according to claim 10, wherein the obtaining module is specifically configured to:
sum the voltages of the N cell units at an $i^{th}$ sampling moment to obtain the voltage of the battery at the $i^{th}$ sampling moment, wherein $1 \leq i \leq K$.

15. The device according to claim 11, wherein the processing module is further configured to:
continue charging the battery when both the first condition and a third condition are satisfied,
wherein, the third condition comprises: the trend of the fitting curve of the voltage of each of the N cell units in the $M^{th}$ sampling period is rising.

16. The device according to claim 15, wherein:
when the fitting curve is a linear fitting curve, that the trend of the fitting curve is rising comprises: a slope of the linear fitting curve is greater than 0; or
when the fitting curve is an exponential fitting curve or a logarithmic fitting curve, that the trend of the fitting curve is rising comprises: a base of the exponential fitting curve or the logarithmic fitting curve is greater than 1.

17. The device according to claim 10, wherein:
the obtaining module is further configured to: obtain a current of the battery at each sampling moment among the K sampling moments;
the processing module is further configured to: stop charging the battery when the first condition is not satisfied but a fourth condition is satisfied,
wherein, the fourth condition comprises: a difference between a preset current and the current of the battery at each sampling moment among the K sampling moments is less than a preset threshold, wherein the preset current is a preset value of the battery in the $M^{th}$ sampling period.

18. The device according to claim 17, wherein the processing module is further configured to:
continue charging the battery when the first condition is not satisfied but a fifth condition is satisfied,
wherein, the fifth condition comprises: the difference between the preset current and the current of the battery on at least one sampling moment among the K sampling moments is greater than the preset threshold.

* * * * *